(12) United States Patent
Wang et al.

(10) Patent No.: US 7,135,678 B2
(45) Date of Patent: Nov. 14, 2006

(54) CHARGED PARTICLE GUIDE

(75) Inventors: Qinsong Steve Wang, Saratoga, CA (US); Tzong Tsong Miau, Sunnyvale, CA (US); Theodore R. Lundquist, Milpitas, CA (US)

(73) Assignee: Credence Systems Corporation, Milpitas, CA (US)

( * ) Notice: Subject to any disclaimer, the term of this patent is extended or adjusted under 35 U.S.C. 154(b) by 180 days.

(21) Appl. No.: 10/887,800

(22) Filed: Jul. 9, 2004

(65) Prior Publication Data

US 2006/0006329 A1    Jan. 12, 2006

(51) Int. Cl.
*H01J 37/244* (2006.01)
*H01J 37/28* (2006.01)

(52) U.S. Cl. ............ 250/310; 250/306; 250/311; 250/397

(58) Field of Classification Search ............ None
See application file for complete search history.

(56) References Cited

U.S. PATENT DOCUMENTS

| | | | |
|---|---|---|---|
| 4,588,890 A | 5/1986 | Finnes | 250/307 |
| 4,680,468 A | 7/1987 | Bouchard et al. | 250/310 |
| 5,097,127 A | 3/1992 | Hildenbrand et al. | 250/310 |
| 5,362,964 A * | 11/1994 | Knowles et al. | 250/310 |
| 6,344,115 B1 * | 2/2002 | Azuma et al. | 204/192.34 |
| 6,630,667 B1 | 10/2003 | Wang et al. | 250/310 |
| 6,646,262 B1 * | 11/2003 | Todokoro et al. | 250/310 |

OTHER PUBLICATIONS

"Yttrium Silicate—Cerium Doped P47" Applied Scintillation Technologies, located at www/appscintech.com, Nov. 30, 2000.

* cited by examiner

*Primary Examiner*—Nikita Wells
(74) *Attorney, Agent, or Firm*—Dorsey & Whitney LLP (57) ABSTRACT

A charged particle guide adapted to be coupled with a charged particle detector, such as a secondary electron detector. The charged particle guide, in one example, comprising two wires extending from the charged particle detector toward a source of charged particles, such as secondary electrons emitted from an IC upon application of a focused ion beam. Upon application of a bias voltage, the charged particle guide introduces a collecting electric field that attracts charged particles and directs the charged particles to the charged particles detector.

22 Claims, 8 Drawing Sheets

CHARGED PARTICLE GUIDE

FIELD OF THE INVENTION

The present invention involves a charged particle guide, and more particularly involves a charged particle guide for enhancing collection of secondary electrons in a focused ion beam tool.

BACKGROUND

Charged particle beam systems, such as focused ion beam ("FIB") systems, have found many applications in various areas of science and industry. For example, in the semiconductor industry, FIB systems are used for integrated circuit ("IC") probe point creation, circuit editing, failure analysis, and numerous other applications. A FIB tool typically includes a particle beam production column designed to focus an ion beam onto the IC at the place intended for the desired intervention. Such a column typically comprises a source of ions, such as Ga+, produced from liquid metal. The Ga+ is used to form the ion beam, which is focused on the IC by a focusing device comprising a certain number of electrodes operating at determined potentials so as to form an electrostatic lens system. Other types of charged particle beam systems deploy other arrangements to produce various charged particle beams.

Successful use of a FIB tool depends, in varying degrees, on obtaining high resolution images of the IC or other sample. The images allow the user to view the IC during use of the FIB tool. Various phenomena, such as secondary electrons, ions, neutrons and photons, are available for monitoring FIB editing and generating images. Secondary electrons, in particular, are emitted as a result of the ion beam incident upon the IC. A common type of the secondary electron detector ("SED") in FIB systems involves an Everhart-Thornley type design using scintillator. A scintillator typically includes a thin glass disk coated with a phosphor that converts energy from secondary electrons into light photons. The scintillator collects some of the secondary electrons emitted from the IC and generates photons responsive to the secondary electrons. In the photomultiplier tube, each photon generates multiple electrons, which are then used to generate an image.

Different material characteristics provide different numbers of secondary electron emissions. For example, with regard to an IC, a dielectric emits substantially less electrons than a metal. Typically, the greater the number of electrons, the brighter the image. Lack of electrons provides a dark image. By rastering the ion beam in a grid-like pattern, the contrast differences are used to generate an image of the target portion of the IC. To generate a clear and accurate image, the secondary electron collection efficiency is an important aspect of any FIB tool. Oftentimes, a large portion of the secondary electrons are emitted away from the SED, making collection difficult.

A practice referred to as "circuit editing" is one example of a use for a FIB tool. Circuit editing involves employing an ion beam to remove and deposit material in an IC with precision. Through removal and deposit of material, electrical connections may be severed or added, which allows designers to implement and test design modifications without repeating the wafer fabrication process. Due to the small scale of the circuit editing process, its success depends strongly on FIB image quality, which, as discussed above, is directly linked to the number of secondary electrons detected by the secondary electron detector.

Circuit editing success also depends on a process referred to as "endpointing." Endpointing involves determining when to stop the FIB milling operation. It is the objective of the operator to stop the milling process at an interface at which the secondary electron signal changes. In one example, endpointing involves detecting the secondary electron signal as the ion beam drills down into the IC. The emission volume is dependent on the material the beam is milling. As mentioned above, metal emits a greater number of secondary electrons than a dielectric. Thus, if the electron emission characteristics are detectable, then boundaries between dielectrics and metals are detectable. The current used to generate an ion beam determines the power of the beam and the size of the hole generated by a beam. As vertical interconnects in an IC get laterally smaller, the ion beam etching current must be decreased. Besides reducing the hole size, the secondary electron signal also decreases. Thus, endpointing becomes more difficult as the secondary electron emission decreases. Further, as the depth of a milling operation increases, the number of secondary electrons that escape the hole becomes less. As such, with less secondary electrons to detect, high collection efficiency becomes more important.

One way to improve the collection efficiency of a SED involves the application of a high voltage (~10 kV) to the scintillator surrounded by a grounded cap to produce a collection electric field that attracts the secondary electrons. One such system is described in U.S. Pat. No. 6,630,667 titled "Compact, High Collection Efficiency Scintillator for Secondary Electron Detection," to Wang et al. and issued Oct. 7, 2003, which is hereby incorporated by reference herein. Through the generation of such an electric field, some of the secondary electrons initially emitted in directions away from the SED, are attracted to the scintillator thereby increasing the collection efficiency. Such a system has been successfully employed in Credence Systems Corporation's IDS P3X® FIB system.

However, in FIB systems where it is difficult or impossible to introduce such an collection field proximate the sample, improving secondary electron collection efficiency and its attendant image improvements remains a problem.

Moreover, in some instances, when a high voltage is applied to the SED, the SED behaves as a focusing lens causing secondary electrons to strike the scintillator disc within a very small discrete spot. Over time, a "burn" spot will result with much or all of the phosphor burned from the scintillator disc, leading to reduced detection and a reduced lifetime of the disc. The lifetime of the scintillator disc is further shortened when too many secondary electrons strike the disc as is the case when the primary ion beam current is high. In many instances, a less powerful ion beam might be employed for a particular operation. However, because of the need to detect secondary electrons, a higher beam current is employed to cause the emission of a greater number of secondary electrons.

It is with this background in mind that the inventors developed the various embodiments of the invention described below.

SUMMARY OF THE INVENTION

The present invention has various aspects. One aspect of the invention involves a charged particle tool adapted to generate a charged particle beam and direct the particle beam on a sample, such as an integrated circuit. The charged particle tool comprises a platform for supporting the sample and a charged particle detector arranged proximate the platform. The charged particle detector may comprise a secondary electron detector employing a scintillator. A charged particle guide is operably associated with the charged particle detector. The charged particle guide comprises a first elongate member and a second elongate member. The elongate members are arranged to extend from the charged particle detector toward the platform.

In one particular aspect, the charged particle guide comprises a first wire and a second wire fabricated with stainless steel, platinum, nickel, chromium, palladium or other suitable material or alloy. A first tip region of the first wire may be arranged adjacent the platform and a second tip region of the second wire may also be arranged adjacent the platform. Depending on any particular usage of the invention, the tips may vary in distance from the platform, may be straight or define one or more angularly offset sections, and may be coplanar or non coplanar, mirror images, or each define unique shapes. The first tip region may be generally parallel with the second tip region. Further, the first tip region and the second tip region may be arranged to either side of a location on the platform where the charged particle beam is incident upon the a sample supported on the platform.

In another particular aspect, the charged particle tool may include a column housing an ion beam production facility and ion optics, the column and the platform grounded and arranged in close proximity. Further, the first and second elongate members of the charged particle guide may be arranged to introduce a collecting electric field proximate a sample supported on the platform. Particularly, the first and the second elongate members are arranged proximate the platform for collection of secondary charged particles. To generate an electric field to attract charged particles, such as secondary electrons, a bias voltage is applied to the charged particle guide. The shape of the electric field is dependent upon the length, shape, thickness, and other aspects of the elongate members. Thus, depending on any particular implementation of the invention, the elongate members, such as the wires discussed above, may be of various shapes, sizes, and lengths to tailor the collecting electric field to the particular use of the charged particle guide.

The bias voltage applied to the charged particle guide, each member, the charged particle detector and other components of the charged particle tool also impact the collecting electric field. Thus, variations in application of the bias voltage are possible. In one aspect, a first voltage is applied to the secondary electron detector housing to define a first collecting electric field and a second voltage is applied to the charged particle guide to define a second collecting electric field. The charged particle guide bias voltage may be less or greater than the charged particle detector housing bias voltage. To collect negatively charged particles, the first and the second voltages are positive to create a first positive collecting electrical field and a second positive collecting electrical field to attract secondary electrons emitted from a sample on the platform upon application of the charged particle beam thereto. Due to the presence of the charged particle guide, secondary electrons are attracted to the scintillator disc, but are not concentrated in a discrete location thereon, which helps to reduce wear.

In the case of a focused ion beam tool or other charged particle type tool used in IC testing, the first and the second elongate members are arranged proximate the platform to enhance generation of an end pointing trace. The first and the second elongate members may also be arranged proximate the platform to enhance image generation during a circuit editing procedure.

Another aspect of the invention includes a charged particle detector assembly. The charged particle detector assembly comprises a charged particle detector, such as secondary electron detector employing a scintillator, with a first elongate member and a second elongate member coupled with the charged particle detector. The first and second elongate members extend away from the charged particle detector. Further, at least one electrical connection point is arranged to supply at least one bias voltage to the first and the second elongate members. The elongate members may each comprise a wire fabricated with stainless steel, nickel, chromium, palladium and platinum.

The secondary electron detector may comprise a housing arranged circumferentially about the scintillator, and wherein the first elongate member and the second elongate member are electrically coupled with the ring. Alternatively, the ring may be coupled with the elongate members to form an assembly, which is then coupled with the secondary electron detector housing. In one particular aspect, the scintillator defines a disk shape defining an axis. The first elongate member and the second elongate member are coupled with the ring and each define a first section extending from the secondary electron detector generally parallel with the axis of the scintillator. Further, the first and the second elongate members may each define a second section electrically coupled with the first section, the second section extending toward the axis of the scintillator. Still further, the first and second elongate members may each define a third section electrically coupled with the second section, the third section extending toward the axis of the scintillator at less an angle than the second section. Finally, the first and second elongate members may each define a fourth section electrically coupled with the third section, the fourth sections extending substantially parallel the fourth section and further extending at an angle with respect to the axis of the scintillator.

It is also possible to include additional elongate members. In one aspect, at least one additional elongate member is coupled with the charged particle detector. The first, the second, and the at least one additional elongate member extending from the charged particle detector. Moreover, the at least one electrical connection point is arranged to supply the at least one bias voltage to the first, the second, and the at least one additional elongate member.

It is also possible to electrically insulate the first elongate member and the second elongate member from the charged particle detector housing. A first electrical connection may be adapted to supply a first bias voltage to the charged particle detector housing and a second electrical connection may be adapted to supply a second bias voltage to the first and the second elongate members. Moreover, the first elongate member may be electrically isolated from the second elongate member. In such an arrangement, a first electrical connection provides a first bias voltage to the first elongate member, a second electrical connection provides a second bias voltage to the second elongate member and third electrical connection provides a third bias voltage to the charged particle detector housing. As discussed above, the shape, size, length and other features of the elongate members may be varied in any particular implementation. Additionally, the bias voltages may differ depending on a particular implementation.

Finally, another aspect of the invention includes a charged particle guide for directing charged particles toward a charged particle detector. The charged particle guide comprises a first conductive elongate member and a second conductive elongate member coupled with the first conductive elongate member. The first and the second electrically conductive elongate members are in electrical communication. Additionally, the first and the second electrically conductive elongate members are adapted to be operably associated with a charged particle detector. Upon application of a bias voltage to the first and the second conductive members an electrical collection field is generated that is adapted to attract charged particles to the charged particle detector. The first conductive member may comprise a first means for attracting charged particles and the second conductive member may comprise a second means for attracting charged particles. Additionally, the first and second attracting means may be coupled via a means for electrically connecting the first means for attracting charged particles with the second means for attracting charged particles. An electrical insulator may be coupled with the first and second conductive members so that the first and second conductive members are electrically isolated and biased at a different voltage from the charged particle guide when connected thereto.

DETAILED DESCRIPTION OF EMBODIMENTS OF THE INVENTION

One aspect of the present invention involves a charged particle guide that attracts and directs charged particles toward a charged particle detector, such as a scintillator disk of a secondary electron detector, and thereby improves its collection efficiency. The charged particle guide includes a plurality of members extending from the charged particle detector toward a sample. A bias voltage, or range of voltages, is applied to the members to introduce an electric field proximate the sample. When employed in a tool that generates a charged particle beam and directs the beam onto the sample, the electric field attracts charged particles emitted from the sample and directs the charged particles to the charged particle detector.

One particular configuration of the invention involves a charged particle guide coupled with a secondary electron detector of a FIB tool. The charged particle guide, in one particular configuration, includes a pair of wires extending from secondary electron detector toward a target IC. The wires are electrically biased and thereby create an electric field adapted to attract and guide the charged particles emitted from the IC to the charged particle detector upon application of the ion beam.

The following discussion focuses primarily on an embodiment of the invention involving a charged particle guide employed in a FIB tool. However, a charged particle guide in accordance with the present invention may be employed to attract and guide charged articles of various types, in various applications, and in various charged particle tools. For example, application of a focused ion beam to a sample may also cause emission of positively charged secondary ions albeit at a less number than secondary electrons. To configure a charged particle guide to collect positively charged secondary ions, a negative bias, at a much higher voltage than for collection of secondary electrons, is applied to the charged particle guide. In another example, in an electron beam tool or "E-Beam" tool, high energy electrons are directed toward a sample, which also causes the emission of secondary electrons. In an E-Beam tool employing a charged particle guide conforming to the present invention, a positive bias is applied to the wires to attract and guide the secondary electrons.

Figure 1:
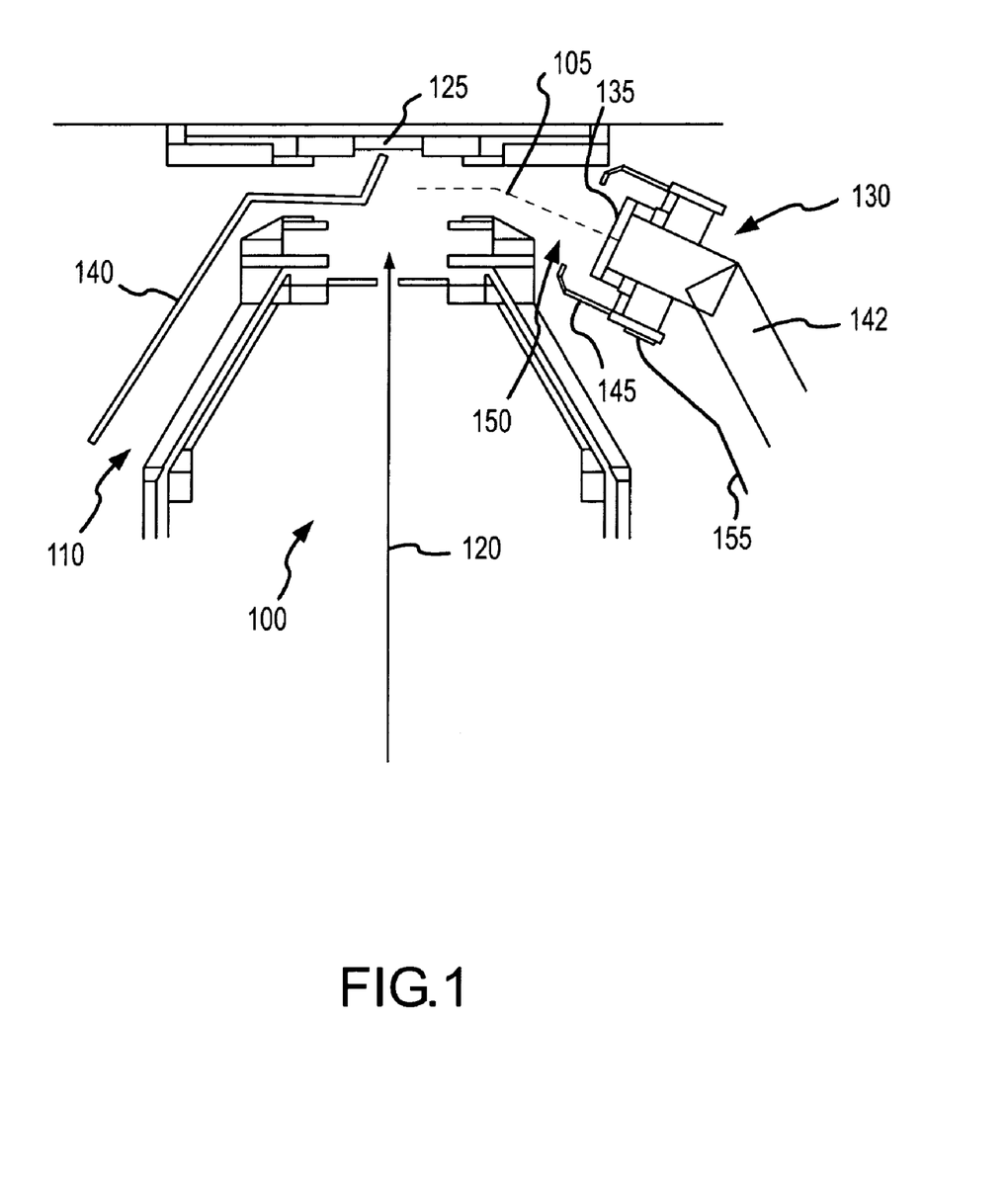
FIG. 1 is a partial side section view of a focused ion beam tool employing a charged particle guide, in accordance with one embodiment of the present invention.

FIG. 1 is a partial side section view of a FIB tool 100 employing a charged particle guide 105, in accordance with one implementation of the present invention. The focused ion beam tool includes a column 110 that provides a focused ion beam 120 directed toward an IC 125, which is referred to as a device under test ("DUT") when being tested, edited, etc. To provide the focused ion beam, the column includes an ion source, optics, and other structure (not shown). Further the column may be a coaxial photon-ion column, which is especially useful for editing flip-chip devices. One suitable coaxial photon-ion column that may employ a charged particle guide, in accordance with the present invention, is described in United States Patent Application Publication US 2003/0102436 titled "Column Simultaneously Focusing a Particle Beam and Optical Beam," published Jun. 5, 2003, a paper titled "Coaxial Ion-Photon System" by C. C. Tsao, Q. S Wang, P. Bouchet, and P. Sudraud published by Elsevier Science Ltd., 2001, and a paper titled "Editing of IC Interconnects Through Back Side Silicon With a Novel Coaxial Photon-Ion Beam Column" by Chun-Cheng Tsao, Pierre Sudraud, Patrick Bouchet and Mark Thomspon, which are hereby incorporated by reference herein.

A secondary electron detector 130 (the "SED"), is arranged adjacent the upper end of the column 110 and the DUT 125. The secondary electron detector comprises a scintillator disk 135, which, as discussed above, includes a phosphor coating that is adapted to convert incident electrons into the photons. From the scintillator disk, the photons travel down a light pipe 142 extending generally downwardly from the secondary electron detector 130. Although not shown, the light pipe is coupled with a photomultiplier tube that converts each incident photon into multiple electrons that may be used to provide an image of the DUT.

In FIG. 1, a chemistry injector tube 140 (sometimes referred to as a "gas delivery jet") is arranged to provide gas to the DUT 125 depending on the use of the FIB tool 100. For example, XeF2 may be used in circuit editing processes to perform edits. Many of the gases that may be employed in a FIB tool may have an aging effect on the scintillator disk 135. As will be recognized from the discussion below, a charged particle guide 105 conforming to the present invention, allows the secondary electron detector 130 and scintillator disk to be located further from the DUT and gas delivery jet, while still maintaining a high collection efficiency. Arranged further from the gas delivery jet 140, the scintillator disk 135 is exposed to a lesser amount of chemicals and thus ages at a lesser rate than with a FIB tool requiring the scintillator be placed in closer proximity to the gas source. Additionally, arranging the secondary electron detector 130 further away from the DUT 125 allows more physical spacing between tool components in the area around the DUT platform.

The secondary electron detector 130 includes a cap 145 that is attached to the body of the secondary electron detector and extends outwardly therefrom. At its outer end, arranged between the scintillator 135 and the DUT 125, the cap defines a circular opening 150 with a diameter slightly larger than the diameter of the scintillator. One suitable secondary electron detector and cap arrangement is described in U.S. Pat. No. 6,630,667 titled "Compact, High Collection Efficiency Scintillator for Secondary Electron Detection" (the "Wang patent") discussed above. In the Wang patent, the end cap is grounded. However, in some implementations of the present invention, the end cap 145 is biased. In one particular implementation, discussed further below, the end cap is biased to the same voltage as a charged particle guide 105 conforming to the present invention. In the Wang arrangement with a grounded cap, secondary electrons may be guided to a small spot or discrete region on the scintillator disk which can cause excessive wear of the scintillator material. As discussed below, besides enhancing the collection efficiency of the secondary electron detector 130, embodiments of the present invention with a biased cap and charged particle guide may also cause wider distribution of the secondary electrons incident on the scintillator disk 135 reducing wear thereof.

Figure 6:
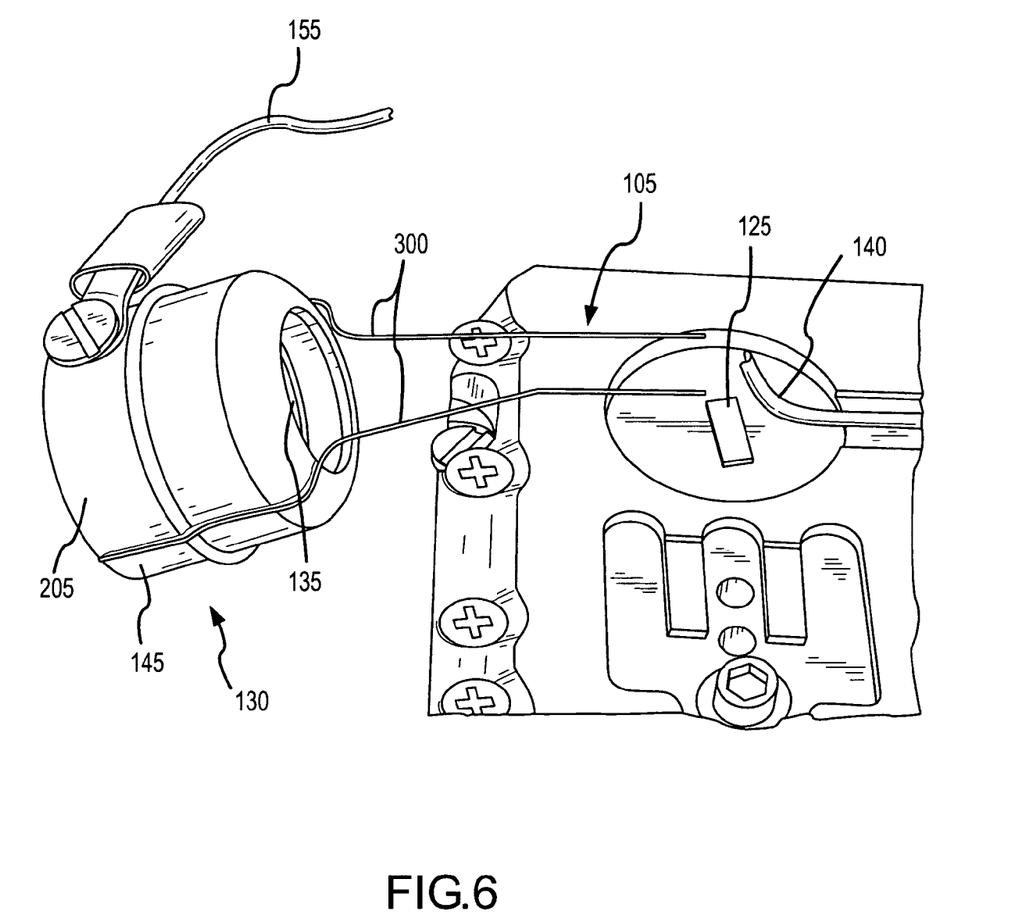
FIG. 6 is a partial close up isometric view of the charged particle guide of FIG. 2 coupled with a secondary electron guide cap and with the secondary electron guide arranged between the end of the focused ion beam column and the platform for mounting a device under test.

The charged particle guide 105 is electrically coupled with the detector cap 145 and arranged to extend to a location adjacent the DUT 125. FIGS. 2–5 illustrate an isometric view, a top view, a side view, and a front view, respectively, of a charged particle guide 105, in accordance with one implementation of the present invention. FIG. 6 is a partial close up isometric view of the charged particle guide of FIG. 2 coupled with a secondary electron detector cap and with the secondary electron guide arranged between the end of the focused ion beam column and the platform for mounting a device under test. In this implementation, the charged particle guide comprises two elongate members 200. The elongate members are each electrically coupled with a ring 205, which is adapted to be fastened around the cap 145. Alternatively, the elongate members may be electrically connected directly to the cap.

It is also possible to electrically insulate the detector cap 145 from the charged particle guide 105. In such an arrangement, the detector cap may be biased at voltage different from the charged particle guide. Moreover, the detector cap might not be biased, and a bias only applied to the charged particle guide. Further, it is also possible to electrically insulate the members of the charged particle guide and bias each member at a different voltage. For example, in a charged particle guide 105 employing two wires 200, each wire might be insulated from the other and biased independently. Such an arrangement would allow for the generation of differently shaped collection fields depending on how the wires were biased as well as other factors, such as the shape and the length of the wires.

Figure 2:
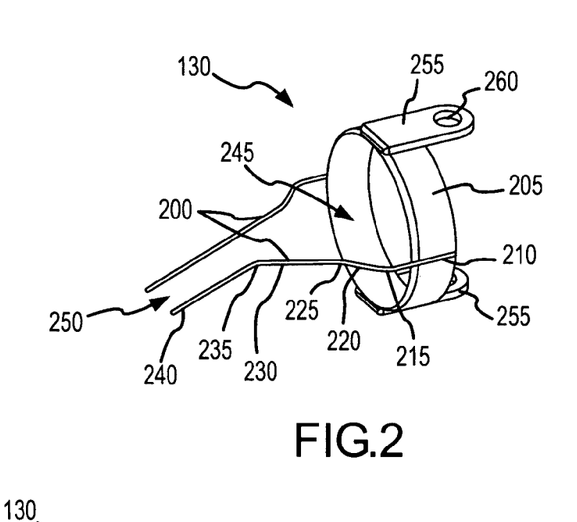
FIG. 2 is an isometric view of a charged particle guide connected with a ring, in accordance with one embodiment of the present invention.
Figure 3:
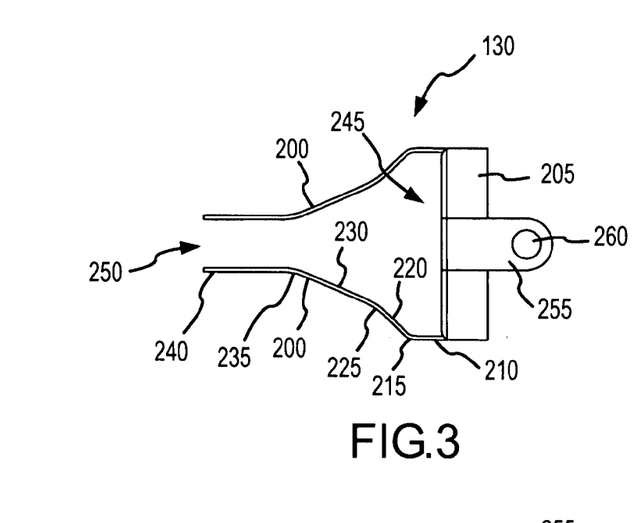
FIG. 3 is a top view of the charged particle guide of FIG. 2.
Figures 4, 5:
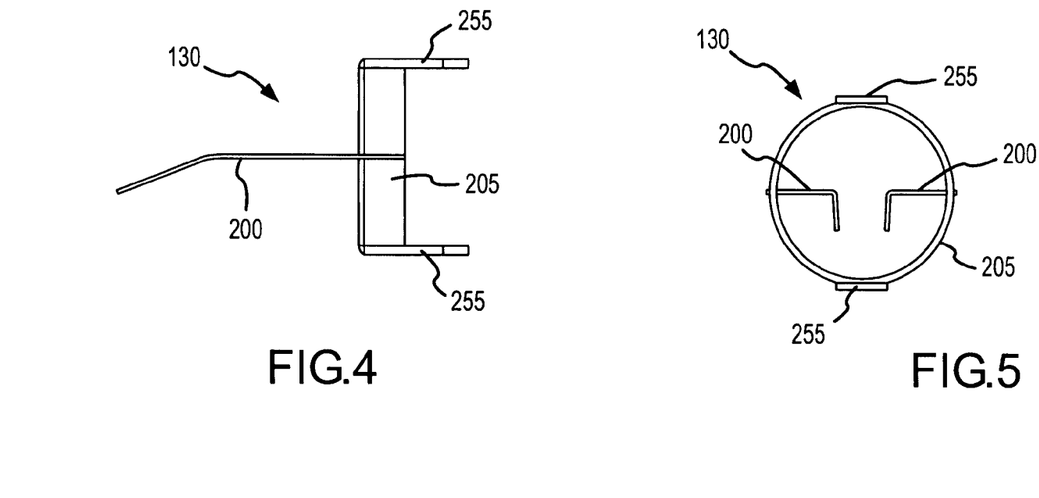
FIG. 4 is a side view of the charged particle guide of FIG. 2.
FIG. 5 is a front view of the charged particle guide of FIG. 2.

In one implementation, each elongate member 200 is a stainless steel wire or rod. Stainless steel is used because it is resistant to the corrosion, degradation, and chemical reactions from the chemical gases that are often used in various FIB operations. It is possible that other electrically conductive materials, such as Nickel (Ni), Chromium (Cr), Platinum (Pt), Palladium (Pd), alloys, and the like, may be used in place of stainless steel. Although a wire is shown, it is possible to use other shapes and sized material depending on the particular environment, tool, and other factors such as maintaining small cross sections to avoid intercepting charged particles to be collected.

The wires 200 are mechanically coupled to the ring 205 about 180 degrees apart. The wires may be tungsten inert gas ("Tig") welded, soldered, spot welded, or otherwise coupled with the ring to achieve an electrical connection between the ring 205 and the wires 200. As mentioned above, an alternative embodiment of the invention has the ring electrically isolated from the wires, which allows different bias voltage application to the ring and wires. The ring defines a longitudinal axis, which when connected with the cap 145 is arranged coaxially with the longitudinal axis of the scintillator disk 135.

The wires extend perpendicularly from the ring, and define a multidimensional shape, including three curves and four generally straight sections. The first, second, and third sections are in a first plane, and the fourth section is in a second plane arranged at an angle with respect to the first plane. The first section 210 is welded to the ring 205, and extends perpendicularly therefrom. The first curve 215 orients the second section 220 at an angle with respect to the first section. The second section of both wires 200 are directed generally toward the longitudinal axis of the ring. As such, the second sections converge. The second radius 225 orients the 230 third section at an angle with respect to the second section 220. The third section is also directed toward the longitudinal axis of the ring, but at a lesser angle than the second section. As such, the third sections are also converging. The third radius 235 orients the fourth section 240 in the second plane. Further, the third radius orients the fourth section of each wire generally parallel to the other. From FIG. 2, it can be seen that the two wires 200 form an inverted funnel-like shape, with the wide end 245 of the funnel at the SED opening 150 and the narrow end 250 of the funnel directed toward the DUT 125.

The ring 205 includes two tabs 255 extending generally perpendicular the ring, but in the opposite direction as the wires 200. The tabs define an aperture 260 which may be used to secure the ring to the cap 145 housing. The aperture may further receive a bolt for attachment of a wire 155 that provides the bias voltage to the charged particle guide 105 as well as the cap. In an embodiment adapted to allow independent bias voltage application to the cap and the charged particle guide, additional bias wire attachments are employed. The bias wire may also be directly welded or otherwise attached to the ring 205. Further, as noted above, it is possible to connect the charged particle guide 105 wires 200 directly to the cap 145 rather than the ring. The ring, however, provides a convenient means to retrofit a charged particle guide, in accordance with the present invention, to secondary electron detectors 130 of FIB tools already deployed at customer locations with minimal down time of the FIB tool 100.

In one particular implementation for use in a Credence Systems Corporation IDS OptiFIB system, a charged particle guide 105 conforming to the invention is fabricated with two stainless steel wires 200 of 0.34 mm diameter each. The wires should be stiff to limit or suppress vibrations, which might result in electrical field noise on the deflection field. Further, stainless steel is an excellent secondary electron emitter and any electrons striking the wires would have a greater chance of contributing to the collected signal. The angle between the primary ion beam 120 and the normal to the plan spanned by the two wires is about 6o. The separation between the tips of the two wires is about 5.5 mm. The specific guide shape near the secondary electron detector cap 145 has less influence on charged particles guiding and attraction due to the strong field of the second electron detector 130, in some implementations. Thus, as the secondary electrons are guided to the scintillator 135, the influence of the secondary electron detector field increases dramatically and dominates the influence of the charged particle guide 105. Measured from the cap to the end of the guide, the distance is about 31 mm. The end of the guide should not extend beyond the primary charged particle beam axis, in one implementation.

The distance from the tips of the wires 200 to the DUT 125 is about 2.85 mm when the DUT is at the optic focal plan of the column 110. A positive DC voltage of +250 V DC may be applied to a charged particle guide 105, such as with a Bertan™ high voltage power supply (Model: PMT-30CP-1) which has a specification of less than 6 mV ripple. The bias voltage may be adjusted in any particular context to obtain an optimum performance. Any suitable low ripple high voltage supply may be used to supply the bias voltage. Generally, the wider the separation between the two wires 200, the higher the bias voltage to obtain optimal secondary electron attraction and guidance.

The voltage range applied to the charged particle guide 105 should be balanced with its impact on distorting the placement of the ion beam 120. As the ion beam has a positive charge, the presence of the positively charged guide and its field may deflect the beam. With a low ripple supply, the field of the charged particle guide is essentially constant. Thus, distortion of the ion beam may be compensated for to account for a constant deflection. Significant field strength variations, such as with a noisy voltage supply, may result in image noise and/or distortion due to variable beam deflections.

Although some particular charged particle guide arrangements are shown and discussed herein, other shapes, sizes, and configuration are possible depending on the particular arrangement of the FIB tool 100, the distance between the secondary electron detector 130 and the ion beam 120 and/or the DUT 125, the diameter of the scintillator 135, the shape of the scintillator and any number of other factors. For example, if the scintillator is farther from the DUT, then the wires 200 may be of greater length; if the scintillator disc is larger, then the angles and section lengths may be greater, if the applied voltage is greater, then the wire separation may be greater, etc.

Further, rather than a straight wire bent into a configuration with straight sections separated by radii, it is possible to bend each wire 200 in a manner that defines a continuous multidimensional sweeping curve. It is also possible to weld wire/rod sections together rather than bend a single length of wire.

In alternative embodiments, it is not necessary that the wires 200 be mirror images. Moreover, additional wires, i.e., more than two, may be employed in other configurations. Further, the axis of the charged particle guide 105, with various numbers and arrangement of wires, can be made in parallel, including coaxial, to the axis of primary charged particle beam. Such a coaxial or parallel arrangement would be beneficial if the detector used is coaxial to the column 110. When a bias is applied to the end cap 145 and the charged particle guide 105, an electric field is created that attracts secondary electrons from the DUT 125 during a FIB operation. For attraction of secondary electrons or other negatively charged particles, the charged particle guide is positively biased. For attraction of secondary ions or other positively charged particles, the charged particle guide is negatively biased. As mentioned above, in one particular implementation, a bias voltage of +250 V DC is applied to the charged particle guide. The particular voltage applied in any particular implementation will vary.

Figure 7A:
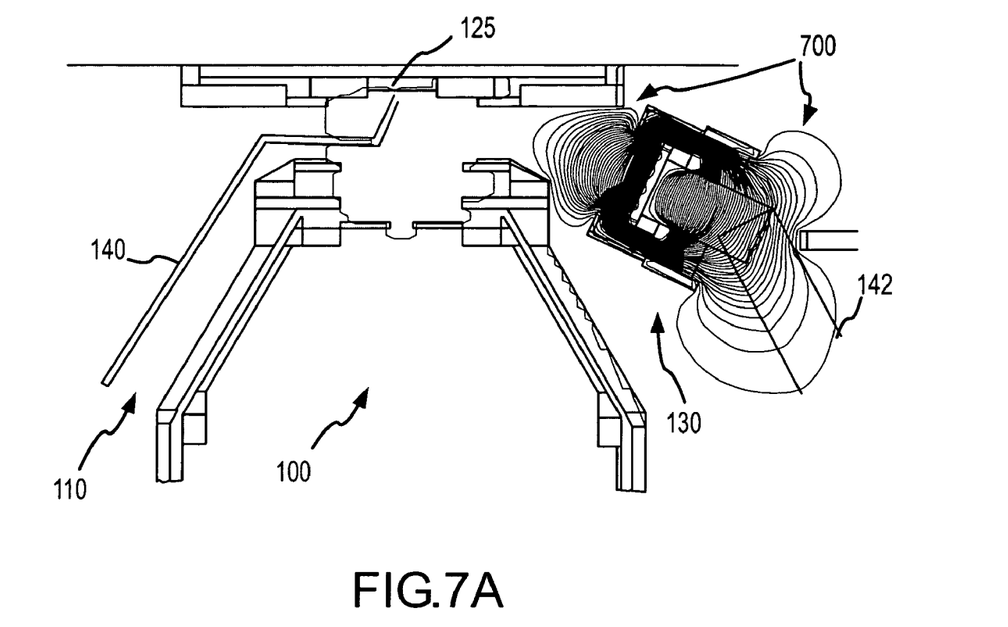
FIG. 7A is a contour plot for a constant secondary electron collection field potential of a scintillator without a charged particle guide.

Computer analysis software was first used to verify the concept of one implementation of a charged particle guide 105, conforming to the present invention. This software is the EO-3D package which is capable of three dimensional charged particle ray tracing based on a finite difference method. FIG. 7A is a contour plot for constant secondary electron collection field potentials 700 of a secondary electron detector 130 in the FIB tool 100 of FIG. 1, but without a charged particle guide. The secondary electron detector is biased to generate the collection field. In one particular example, the bias voltage of the secondary electron detector is +9 kV DC. Biased in such a manner, the secondary electron detector generates the electric field shown in FIG. 7A. However, the column 110 and the sample platform holding the DUT 125 are grounded to 0 Volt. As such, the electric field hardly penetrates into the area between the column and the DUT.

Figure 7B:
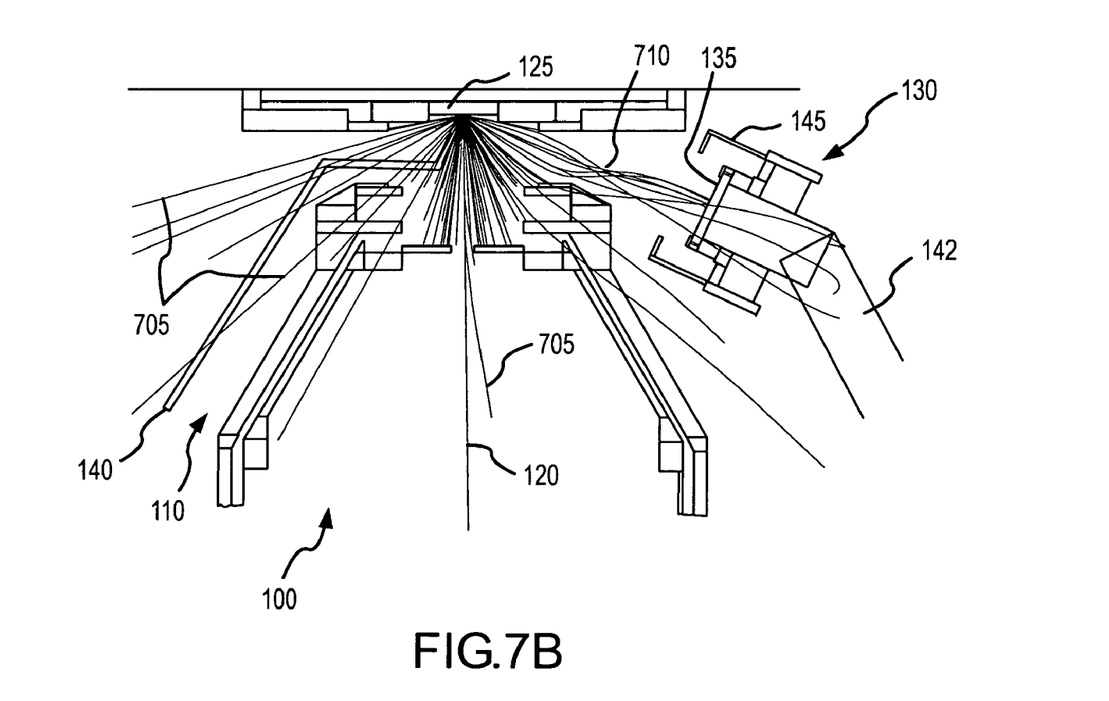
FIG. 7B is a plot of the secondary electron trajectory in a charged particle beam tool without a charged particle guide.

In a FIB tool 100, if the DUT 125 needs to be arranged closer to the FIB column 110, and since both DUT and the FIB column are grounded, a narrow spacing between the column and the DUT results in less penetration into the DUT region of the collecting electric field of the secondary electron detector 130. As such, secondary electrons emitted from DUT will hardly be affected by the collecting electric field of the secondary electron detector alone. As a result, many secondary electrons are not collected by the secondary electron detector. FIG. 7B is a plot of the secondary electron trajectory 705 in the focused ion beam tool 100 of FIG. 7A without a charged particle guide 105. As discussed above, the secondary electrons are emitted in all directions from the DUT 125. Because the collecting electric field does not penetrate closely to the DUT, secondary electrons 710 initially directed at an angle toward the secondary electron detector 130 may be attracted by the collecting field of the secondary electron detector and strike the scintillator 135. However, secondary electrons initially directed at angles away from the secondary electron detector do not come under the influence of the electric field and are not detected.

Figure 8A:
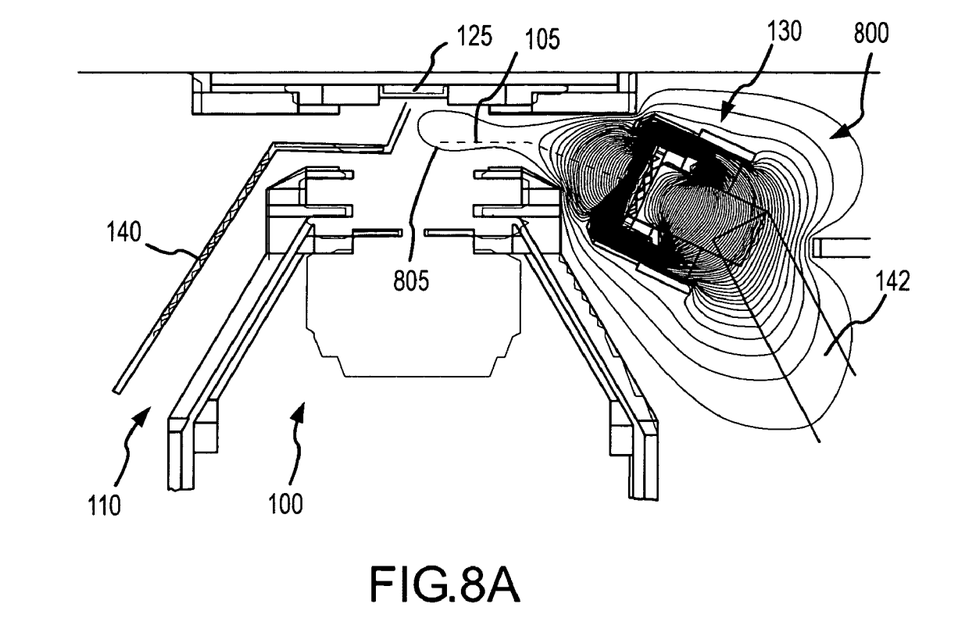
FIG. 8A is a contour plot for a constant secondary electron collection field potential of a scintillator with a charged particle guide, the constant potential field penetrating proximate the device under test.
Figure 8B:
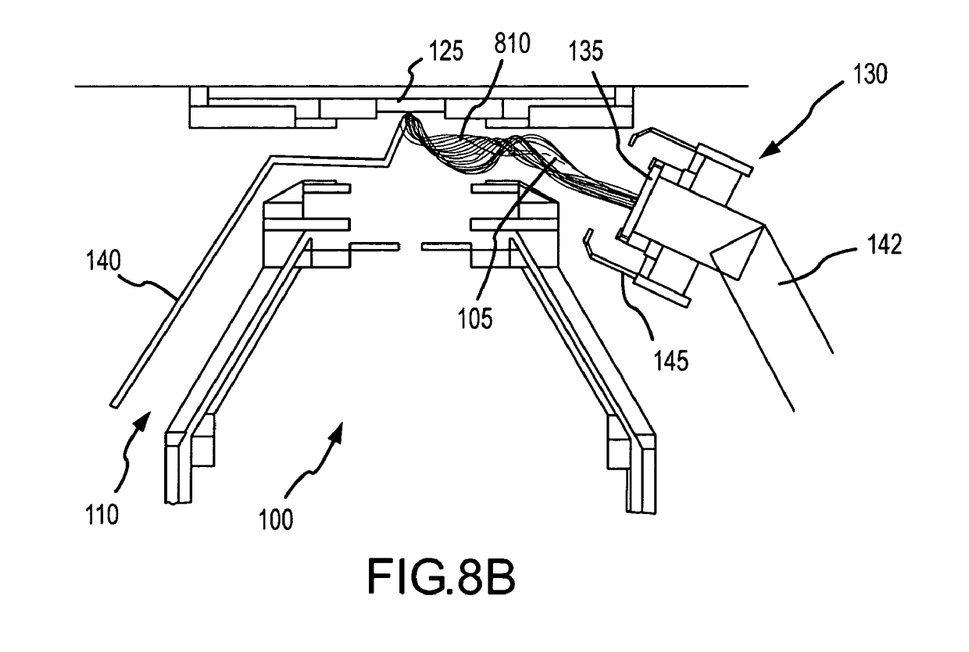
FIG. 8B is a plot of the secondary electron trajectory in a charged particle beam tool with a charged particle guide.

In contrast to FIG. 7A, FIG. 8A is a contour plot for constant secondary electron collection field potentials 800 of a secondary electron detector 130 employing a charged particle guide 105, in accordance with one implementation of the present invention. In this example, a +9 kV DC potential is applied to the secondary electron detector and a +250 V DC potential is applied to the charged particle guide and the detector housing. Note, FIGS. 8A and 8B, show the plan along the axis of the charged particle guide, so one of the charged particle guide wires 200 is shown in hidden line and the other is not shown. A collecting electric field potential 805 generated by the charged particle guide 105 penetrates into the area adjacent the DUT 125. In this example, the overall collecting electric field is a combination of the fields generated by the voltage applied to the secondary electron detector 130 and the voltage applied to the charged particle guide. It will be recognized that the collecting field adjacent the DUT is primarily a result of the charged particle guide 105 bias voltage whereas the collecting electric field adjacent the body of the secondary electron detector 130 and the scintillator disk 135 is primarily a result of the much higher voltage applied to the secondary electron detector.

FIG. 8B is a plot of the secondary electron trajectory 810 in a FIB 100 employing a charged particle guide 105 in the arrangement shown in FIG. 8A. In contrast to FIG. 7B, as shown in FIG. 8B a majority of the secondary electrons 810 initially come under the influence of the collecting electric field 800 of the charged particle guide 105 and secondary electron detector 130 and are guided toward the scintillator disk 135. As such, FIG. 8B illustrates the dramatic improvement in secondary electron collection efficiency for a secondary electron detector 130 and FIB tool 100 employing a charged particle guide 105, in accordance with the present invention.

By positively biasing two metal wires 200 coupled with the secondary electron detector 130, a collecting electric field is introduced into a region where the electric field would otherwise hardly penetrate. Under the influence of the electric field from these electrically biased wires, secondary electrons are guided along the guide towards the secondary electron detector scintillator 135. As a result, the secondary electron detector collection efficiency can be greatly enhanced, which advantageous result is further illustrated in the FIB image brightness and contrast illustrated at FIGS. 9A and 9B, discussed below.

Figure 9A:
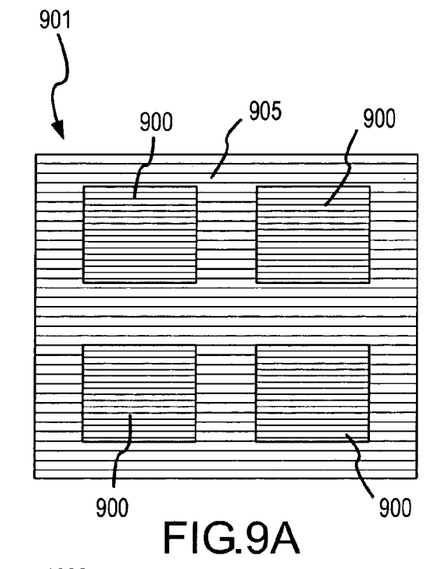
FIG. 9A is a secondary electron image of four areas of dielectric separated by the metal grid pattern therebetween, the secondary electron image from a focused ion beam tool without a charged particle guide.
Figure 9B:
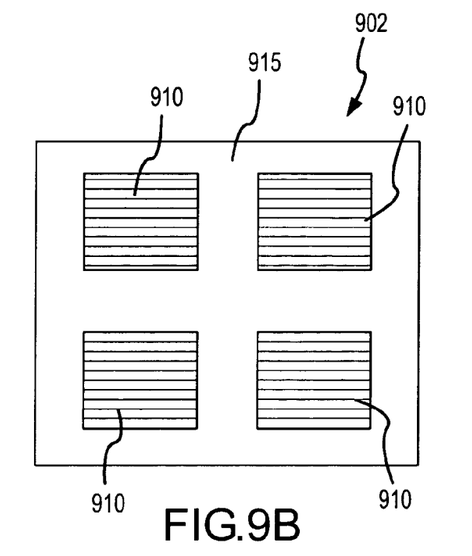
FIG. 9B is a secondary electron image of four areas of dielectric separated by the metal grid pattern therebetween, the secondary electron image from a focused ion beam tool with a charged particle guide.

FIG. 9A is a representative secondary electron image 901 of four areas of dielectric 900 separated by a metal grid pattern 905 therebetween. The representative image was generated based on an actual secondary electron image from a FIB tool 100 without a charged particle guide 105. In contrast, FIG. 9B is a representative secondary electron image 902 of the four areas of dielectric 910 separated by the metal grid pattern 915 therebetween based on an actual secondary electron image from a FIB tool 100 with a charged particle guide 105, in accordance with one embodiment of the present invention. In a FIB image, bright (white) areas are associated with a high concentration of secondary electron detection whereas gray to dark areas are associated with a lower to nearly no secondary electron detection. Metal generally emits more secondary electrons than a dielectric. Thus, the image generated from secondary electrons emitted from a metal region upon application of an ion beam 120 will be brighter that the image of a dielectric.

In FIG. 9A, it can be seen that the image 901 of the metal area 905 is gray, whereas the image 902 of the metal area 915 of FIG. 9B (from a FIB tool 100 with a charged particle guide 105) is much brighter. The dielectric area 900 of the image of FIG. 9A is somewhat darker than the dielectric area 910 of FIG. 9B, as would be expected due to the greater detection of secondary electrons with the charged particle guide 105. Nonetheless, due to the dramatically whiter metal area 915 of FIG. 9B caused by enhanced collection efficiency of the secondary electron detector 130, the contrast between the metal 915 and the dielectric 910 of FIG. 9B is greater than the contrast of FIG. 9A. Thus, the boundary between metal and dielectric is easier to visually identify in FIG. 9B, which provides the user with an enhanced ability to identify IC elements for circuit editing, visually verify circuit editing, and performing other operations using the FIB tool 100 and image more accurately than possible with some FIB tools not employing a charged particle guide 105.

Figure 10A:
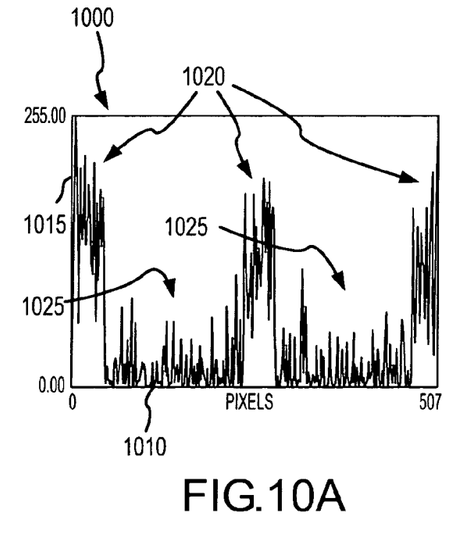
FIG. 10A is a line scan of the secondary electron image of FIG. 9A.
Figure 10B:
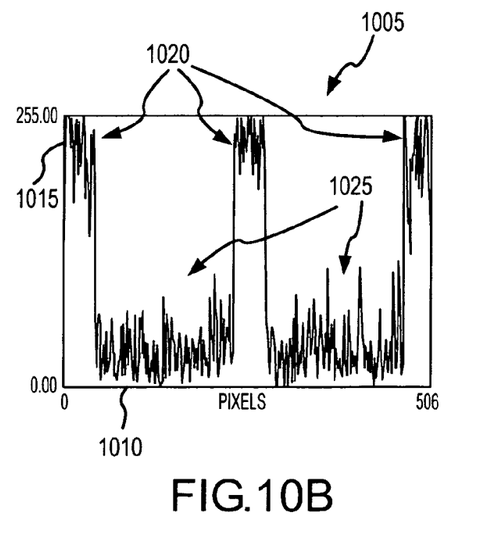
FIG. 10B is a line scan of the secondary electron image of FIG. 9B.

FIG. 10A is a line scan graph 1000 of the actual secondary electron image used to generate the representative image 901 of FIG. 9A, and FIG. 10B is a line scan graph 1005 of the actual secondary electron image used to generate the representative image 902 of FIG. 9B. The horizontal axis 1010 represents pixel locations associated with the raster scan image generation used to create the image of FIGS. 9A and 9B. The vertical axis 1015 represents the brightness, which is proportional to the number of detected secondary electrons, for any particular pixel location. Each graph illustrates a curve with three high regions 1020 associated with a first concentration of detected secondary electrons from the metal regions. Each graph also illustrates two low regions 1025, between the high regions, associated with a second concentration of detected secondary electrons from the dielectric regions.

First, it can be seen that the high regions 1020 in the second graph 1005 are about twice the height of the high regions in the first graph 1000. As such, at least twice as many secondary electrons were detected with a FIB tool 100 employing a charged particle guide 105 conforming to the present invention (FIG. 10B) as opposed to a FIB tool not employing a charged particle guide (FIG. 10A). Second, with respect to the low regions 1025 of secondary electrons detected from the dielectric, it can be seen that slightly more, but not nearly twice the number of secondary electrons were detected with a FIB tool employing a charged particle guide 105 conforming to the present invention (FIG. 10B) as opposed to a FIB tool 100 not employing a charged particle guide (FIG. 10A). As mentioned above, metal generally emits many more secondary electrons than does a dielectric. Due to the high collection efficiency of the charged particle guide, more secondary electrons are collected from both the metal 905 and dielectric 900 regions as reflected in FIG. 1A. However, due to the differences in emission characteristics, the contrast (the difference in secondary electrons from metal and dielectric), is greater in FIG. 10B than in FIG. 10A, and thus provides the sharper image of FIG. 9B.

The enhancement of collection efficiency is not limited to secondary electrons emitted from the surface of a sample. Secondary electrons emerging from a small opening of a high aspect ratio hole will be collected efficiently as well. The mechanism for secondary electrons to escape from a small hole of high aspect ratio has been studied and understood. The stronger collecting field introduced by a charged particle guide 105 conforming to the present invention helps those secondary electrons that have made their ways to near the opening of and to escape from the high aspect ratio hole. Under the guidance of the two wires 200, those secondary electrons are then traveling towards and collected by the SED 130. Therefore, very important end-pointing signals are made stronger with this invention.

Figure 11A:
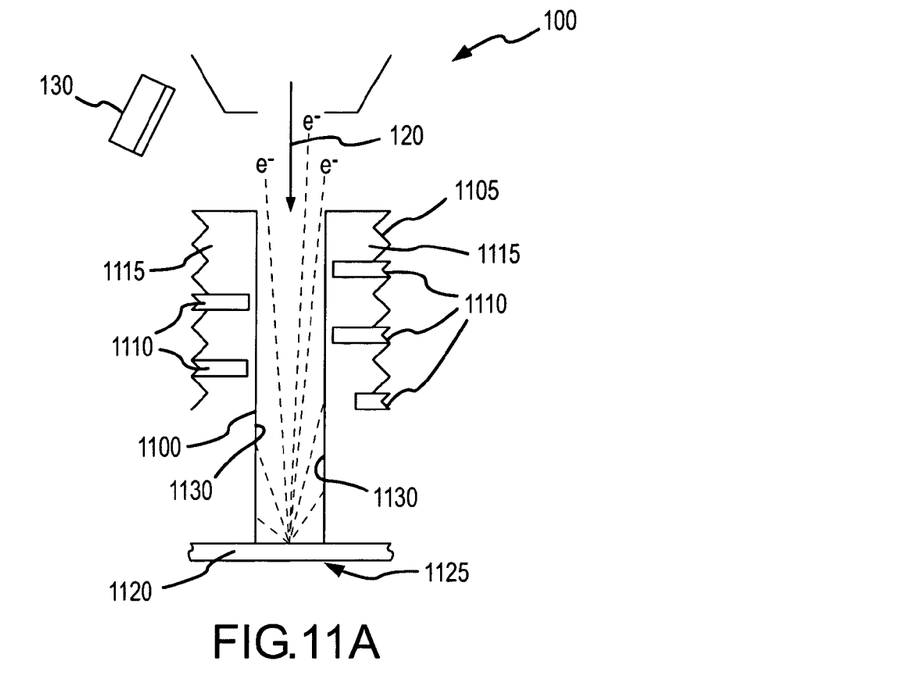
FIG. 11A is a representative image of the secondary electron emission characteristics from a high aspect ration hole in an IC milled by an ion beam, and the secondary electron collection characteristics of a FIB tool without a charged particle guide.

FIG. 11A is a diagram illustrating a focused ion beam tool 100 directing an ion beam 120 to mill a high aspect ratio hole 1100 in an integrated circuit 1105. The integrated circuit includes a number of metal layers 1110 between the dielectric 1115 and the ion beam is incident upon the target metal layer 1120, which is the "end point" 1125 of the milling operation. It is the objective of the FIB operator, to mill the hole between the upper metal layers and stop the milling operation when the target metal layer is reached. It can be seen that at the depth of the target metal layer 1120, many of the secondary electrons are incident upon the side walls 1130 of the hole 1100 and do not escape. In FIG. 11A, the secondary electron detector 130 does not include a charged particle guide 105 to attract secondary electrons escaping from the hole 1100. Thus, the secondary electrons escaping the hole do not come under the attraction of the secondary electron detector 130 because the collecting electron field cannot adequately penetrate into the area adjacent the hole.

Figure 11B:
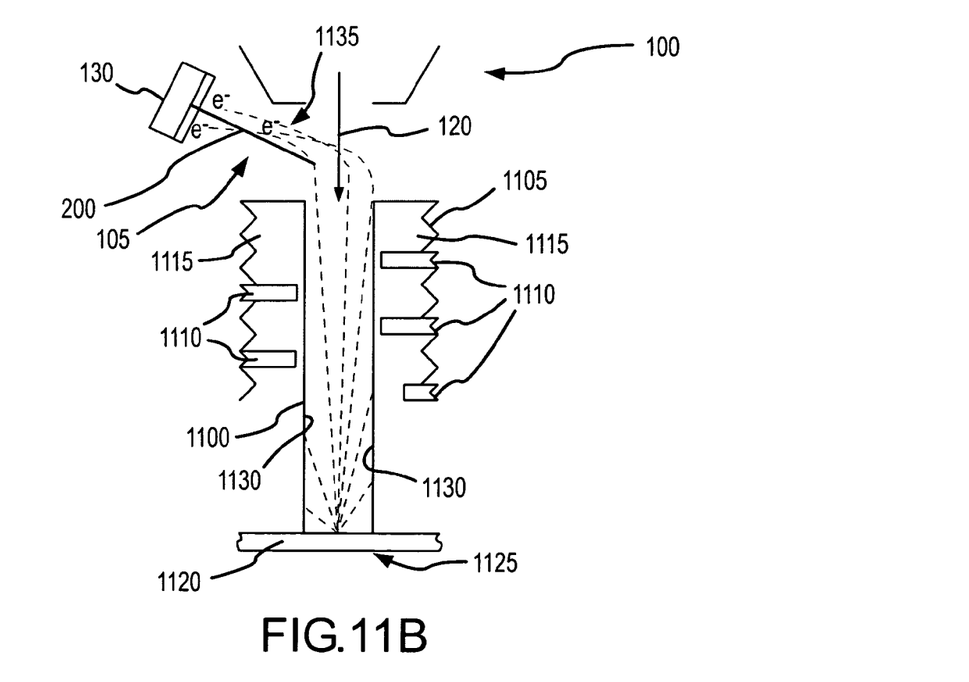
FIG. 11B is a representative image of the secondary electron emission characteristics from a high aspect ration hole in an IC milled by an ion beam, and the secondary electron collection characteristics of a FIB tool with a charged particle guide, in accordance with the present invention.

In contrast, FIG. 11B is a diagram illustrating a FIB tool 100 employing a charged particle guide 105 conforming to the present invention. In this example, the two wires 200 of the charged particle guide are disposed in only one plane. The FIB tool is directing an ion beam 120 to mill a high aspect ratio hole 1100 in the integrated circuit 1105. As with FIG. 11A, the IC includes a number of metal layers 1110 between the dielectric 1115, and the ion beam is incident upon the target metal layer 1120, which is the "end point" 1125 of the milling operation. As with FIG. 11A, many of the secondary electrons emitted from the target metal layer are incident upon the side walls 1130 of the hole and thus do not escape. In contrast to FIG. 11A, the secondary electrons 1135 that do escape the hole 1100 come under the influence of the collecting electric field generated by the charged particle guide 105 and are thus directed to and detected by the secondary electron detector 130.

Figure 12:
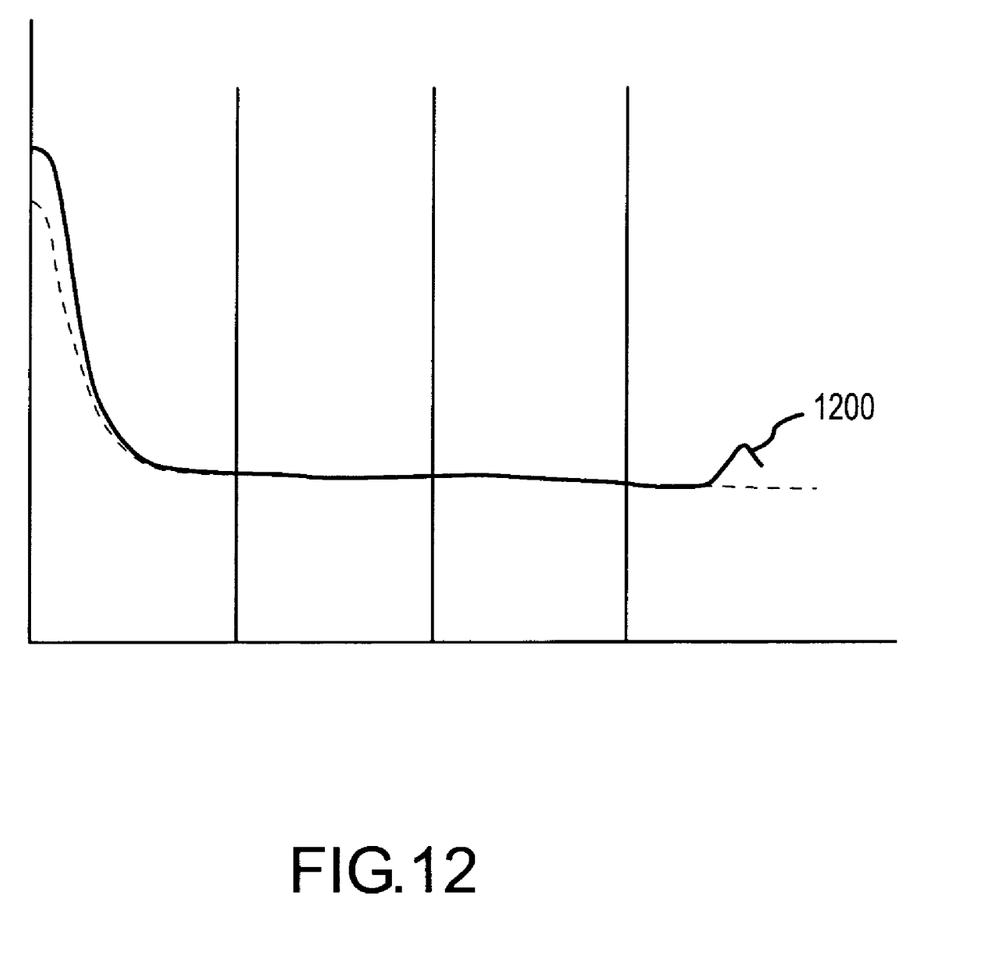
FIG. 12 is an endpoint trace for a focused ion beam hole of 24:1 aspect ratio from a FIB tool employing a charged particle guide (solid line) and from a FIB tool without a charged particle guide (dashed line).

FIG. 12 is an end point trace illustrating the number of secondary electrons detected through the depth of a 0.25× 0.25 μm 24:1 aspect ratio hole, similar to that as illustrated in FIGS. 11A and 11B. The solid line is reflective of the secondary electrons detected by a FIB tool 100 employing a charged particle guide 105 conforming to the present invention. The dashed line is reflective of the secondary electrons detected by a FIB tool 100 without a charged particle guide 105. It can be seen that when the milling operation is first begun, many secondary electrons are initially detected from the surface of the IC 1105. With the charged particle guide 105, more secondary electrons are detected. As the milling operation progresses and the hole deepens into the dielectric 1115, less secondary electrons are emitted and detected by both FIB configurations until the curve flattens out and little or no secondary electrons are detected. However, when the ion beam 120 reaches the target metal layer 1120, such as metal 1, more secondary electrons are emitted. At this point, there is a small rise 1200 in the curve from the FIB tool 100 employing the charged particle guide 105. Thus, an increase in secondary electrons is detected. Based on this end point indicator 1200, the operator knows that he has reached the target layer 1120 and may end the milling operation. Due to the low collection efficiency of the secondary electron detector 130 without a charged particle guide, little or none of the secondary electrons emitted at the target metal are detected and there is no visible rise in the curve for the FIB tool. As such, the operator is not aware that he has reached the end point of the milling operation.

Since aspects of this invention are based on conservation of angular momentum, a single wire can also enhance the collection efficiency. But investigation indicates that a two-wire guide is more efficient than a single wire perhaps because less electrons are intercepted by the wires. Compared with using a single wire, a two-wire secondary electron guide 105 also causes less distortion to the primary ion beam.

As mentioned above, unlike some existing FIB tools, the secondary electron detector cap 145 is no longer grounded, but biased at the same voltage as the charged particle guide 105. As a result, secondary electrons are no longer focused into one small spot at the scintillator disc 135 and the lifetime of the scintillator disc can, therefore, be prolonged. The lifetime of the scintillator disc can further be improved by reducing the bias voltage on the secondary electron guide so that less secondary electrons will strike the scintillator disc when the primary beam current is high. This is possible because the charged particle guide 105 initially attracts the secondary electrons. Further, in some instances, due to the enhanced collection efficiency of the FIB tool 100, lower current beams may be employed in some applications such as high aspect ratio hole drilling.

Although various representative embodiments of this invention have been described above with a certain degree of particularity, those skilled in the art could make numerous alterations to the disclosed embodiments without departing from the spirit or scope of the inventive subject matter set forth in the specification and claims. All directional references (e.g., upper, lower, upward, downward, left, right, leftward, rightward, top, bottom, above, below, vertical, horizontal, clockwise, and counterclockwise) are only used for identification purposes to aid the reader's understanding of the embodiments of the present invention, and do not create limitations, particularly as to the position, orientation, or use of the invention unless specifically set forth in the claims. Joinder references (e.g., attached, coupled, connected, and the like) are to be construed broadly and may include intermediate members between a connection of elements and relative movement between elements. As such, joinder references do not necessarily infer that two elements are directly connected and in fixed relation to each other.

In some instances, components are described with reference to "ends" having a particular characteristic and/or being connected to another part. However, those skilled in the art will recognize that the present invention is not limited to components which terminate immediately beyond their points of connection with other parts. Thus, the term "end" should be interpreted broadly, in a manner that includes areas adjacent, rearward, forward of, or otherwise near the terminus of a particular element, link, component, member or the like. In methodologies directly or indirectly set forth herein, various steps and operations are described in one possible order of operation, but those skilled in the art will recognize that steps and operations may be rearranged, replaced, or eliminated without necessarily departing from the spirit and scope of the present invention. It is intended that all matter contained in the above description or shown in the accompanying drawings shall be interpreted as illustrative only and not limiting. Changes in detail or structure may be made without departing from the spirit of the invention as defined in the appended claims.

The invention claimed is:

1. A charged particle detector assembly comprising:
   a charged particle detector;
   a first elongate member coupled with the charged particle detector;
   a second elongate member coupled with the charged particle detector;
   the first and the second elongate members extending away from the charged particle detector; and
   at least one electrical connection point arranged to supply at least one bias voltage to the first and the second elongate members; and wherein
   the first and the second elongate members each comprise a wire.

2. The charged particle detector assembly of claim 1 wherein the charged particle detector comprises a secondary electron detector.

3. The charged particle detector assembly of claim 2 wherein the secondary electron detector comprises a scintillator.

4. The charged particle detector assembly of claim 3 wherein the secondary electron detector comprises a ring arranged circumferentially about the scintillator, and wherein the first elongate member and the second elongate member are electrically coupled with the ring.

5. The charged particle detector assembly of claim 4 wherein the scintillator defines a disk shape defining an axis.

6. The charged particle detector assembly of claim 5 wherein the first elongate member and the second elongate member are coupled with the ring and each define a first section extending from the secondary electron detector generally parallel with the axis of the scintillator.

7. The charged particle detector assembly of claim 6 wherein the first and the second elongate member each define a second section electrically coupled with the first section, the second section extending toward the axis of the scintillator.

8. The charged particle detector assembly of claim 7 wherein the first and second elongate members each define a third section electrically coupled with the second section, the third section extending toward the axis of the scintillator at less an angle than the second section.

9. The charged particle detector assembly of claim 8 wherein the first and second elongate members each define a fourth section electrically coupled with the third section, the fourth sections extending substantially parallel to each other and further extending at an angle with respect to the axis of the scintillator.

10. The charged particle detector assembly of claim 1 wherein the wire is of a material selected from the group comprising stainless steel, Ni, Cr, Pd, and Pt.

11. The charged particle detector assembly of claim 1 further comprising:
    at least one additional elongate member coupled with the charged particle detector;
    the first, the second, and the at least one additional elongate member extending from the charged particle detector; and
    the at least one electrical connection point arranged to supply the at least one bias voltage to the first, the second, and the at least one additional elongate member.

12. The charged particle detector assembly of claim 1 wherein the first elongate member and the second elongate member are electrically insulated from the charged particle detector.

13. The charged particle detector assembly of claim 12 further comprising a first electrical connection adapted to supply a first bias voltage to the charged particle detector and a second electrical connection adapted to supply a second bias voltage to the first and the second elongate members.

14. The charged particle detector assembly of claim 13 wherein the first bias voltage is different than the second bias voltage.

15. The charged particle detector of claim 13 where the second voltage is less than the first voltage.

16. The charged particle detector of claim 15 wherein the first and second voltages are positive to create a first positive collecting electrical field and a second positive collecting field to attract secondary electrons emitted from a sample.

17. The charged particle detector assembly of claim 1 wherein the first elongate member is electrically isolated from the second elongate member and wherein the at least one electrical connection point comprises a first electrical connection to provide a first bias voltage to the first elongate member and a second electrical connection to provide a second bias voltage to the second elongate member.

18. The charged particle detector assembly of claim 1 wherein the charged particle detector assembly is adapted for use with a charged particle tool having a platform for supporting a sample and wherein the charged particle detector is arranged proximate to the platform.

19. The charged particle detector of claim 18 wherein the first and second elongate members are arranged to introduce a collecting electric field proximate the sample supported on the platform.

20. The charged particle detector of claim 18 wherein the first and second elongate members are arranged proximate the platform for collection of secondary charged particles.

21. The charged particle detector of claim 1 wherein the first elongate member and second elongate member are conductive and whereby the bias voltage generates a collection electrical field adapted to attract charged particles to the charged particle detector.

22. A charged particle detector assembly comprising:
    means for detecting charged particles;
    a first means for attracting charged particles;
    a second means for attracting charged particles;
    a means for electrically connecting the first means for attracting charged particles with the second means for attracting charged particles; and wherein
    the first means of attracting charged particles includes a first wire extending from the means for detecting charged particles and the second means for attracting charged particles includes a second wire extending away from the means for detecting charged particles.

* * * * *